(12) United States Patent
Yoon et al.

(10) Patent No.: US 9,706,653 B2
(45) Date of Patent: Jul. 11, 2017

(54) CONDUCTIVE STRUCTURE BODY AND METHOD FOR MANUFACTURING THE SAME

(71) Applicant: LG CHEM, LTD., Seoul (KR)

(72) Inventors: Junghwan Yoon, Daejeon (KR); Jin Hyong Lim, Daejeon (KR); Yong Chan Kim, Daejeon (KR); Ilha Lee, Daejeon (KR); Ki-Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 159 days.

(21) Appl. No.: 14/766,085

(22) PCT Filed: Nov. 4, 2014

(86) PCT No.: PCT/KR2014/010526
§ 371 (c)(1),
(2) Date: Aug. 5, 2015

(87) PCT Pub. No.: WO2015/065162
PCT Pub. Date: May 7, 2015

(65) Prior Publication Data
US 2015/0373844 A1    Dec. 24, 2015

(30) Foreign Application Priority Data
Nov. 4, 2013 (KR) .................. 10-2013-0133201

(51) Int. Cl.
| B32B 3/00 | (2006.01) |
| H05K 1/09 | (2006.01) |
| G06F 3/041 | (2006.01) |
| G06F 3/047 | (2006.01) |
| H01L 31/02 | (2006.01) |
| H05K 1/02 | (2006.01) |
| H05K 3/06 | (2006.01) |

(Continued)

(52) U.S. Cl.
CPC .............. *H05K 1/09* (2013.01); *G06F 3/041* (2013.01); *G06F 3/044* (2013.01); *G06F 3/047* (2013.01); *H01L 31/02008* (2013.01); *H01L 31/022425* (2013.01); *H01L 31/022466* (2013.01); *H05K 1/0274* (2013.01); *H05K 3/067* (2013.01); *G06F 2203/04103* (2013.01); *Y10T 29/49158* (2015.01)

(58) Field of Classification Search
CPC .......... G06F 3/044; G06F 3/041; G06F 3/047; H05K 1/0274; H05K 1/09; H05K 3/067; H01L 31/022466; H01L 31/02008; H01L 31/022425; Y10T 29/49155; Y10T 29/49158
See application file for complete search history.

(56) References Cited

U.S. PATENT DOCUMENTS

| 2006/0204730 A1 | 9/2006 | Nakamura et al. |
| 2008/0090138 A1 | 4/2008 | Vu et al. |
| 2012/0318585 A1 | 12/2012 | Kim et al. |

(Continued)

FOREIGN PATENT DOCUMENTS

| EP | 1 239 717 A2 | 11/2012 |
| JP | 2007-96164 A | 4/2007 |

(Continued)

*Primary Examiner* — Elizabeth Mulvaney
(74) *Attorney, Agent, or Firm* — Dentons US LLP (57) ABSTRACT

The present specification relates to a conductive structure body and a method for manufacturing the same.

20 Claims, 5 Drawing Sheets

(51) Int. Cl.
*G06F 3/044* (2006.01)
*H01L 31/0224* (2006.01)

(56) References Cited

U.S. PATENT DOCUMENTS

2013/0242485 A1   9/2013   Ohtani et al.
2014/0251429 A1   9/2014   Lim et al.

FOREIGN PATENT DOCUMENTS

CONDUCTIVE STRUCTURE BODY AND METHOD FOR MANUFACTURING THE SAME

TECHNICAL FIELD

This application is a National Stage Application of International Application No. PCT/KR2014/010526, filed Nov. 4, 2014, and claims the benefit of Korean Application No. 10-2013-0133201, filed Nov. 4, 2013, all of which are hereby incorporated by reference in their entirety for all purposes as if fully set forth herein.

The present specification relates to a conductive structure body and a method for manufacturing the same.

BACKGROUND ART

Generally, a touch screen panel may be classified into the following types according to a detection manner of a signal. That is, examples thereof include a resistive type detecting a position when pressed by pressure in a state where a direct voltage is applied while changing a current or voltage value, a capacitive type using capacitance coupling in a state where an alternating voltage is applied, an electromagnetic type detecting a selected position as a change in voltage in a state where a magnetic field is applied, and the like.

In accordance with the recent increase in demand for a large-area touch screen panel, a technology of reducing resistance of an electrode and implementing a large-sized touch screen panel having excellent visibility needs to be developed.

PRIOR ART DOCUMENT

Patent Document

Korean Patent Application Laid-Open No. 2010-0007605

DETAILED DESCRIPTION OF THE INVENTION

Technical Problem

The present application has been made in an effort to provide a conductive structure body which can minimize an influence on conductivity of a conductive pattern and reduce light reflectance of the conductive pattern.

Technical Solution

An exemplary embodiment of the present application provides a conductive structure body including: a substrate; a conductive pattern layer provided on the substrate; and a darkening pattern layer provided on at least one surface of the conductive pattern layer, in which the darkening pattern layer includes a copper-manganese-based material represented by $Cu_aMn_bO_cN_d$.

Another exemplary embodiment of the present application provides a method for manufacturing a conductive structure body, including: preparing a substrate; forming a conductive pattern layer on the substrate; and forming a darkening pattern layer on an upper surface, a lower surface, or the upper surface and the lower surface of the conductive pattern layer, in which the darkening pattern layer includes a copper-manganese-based material represented by $Cu_aMn_bO_cN_d$.

In the copper-manganese-based material, b may be a mass ratio of Mn to the copper-manganese-based material and 0.01 or more and 0.5 or less, c may be a mass ratio of 0 to the copper-manganese-based material and 0.05 or more and 0.6 or less, d may be a mass ratio of N to the copper-manganese-based material and 0 or more and 0.15 or less, and a may be a mass ratio of Cu to the copper-manganese-based material and a remainder value to a sum of the mass ratios of components other than Cu.

Yet another exemplary embodiment of the present application provides a touch screen panel including the conductive structure body.

Still another exemplary embodiment of the present application provides a display device including the conductive structure body.

Still yet another exemplary embodiment of the present application provides a solar battery including the conductive structure body.

Advantageous Effects

In a conductive structure body according to an exemplary embodiment of the present application, it is possible to minimize an influence on conductivity of a conductive pattern layer and improve absorbance of the conductive pattern layer, thereby preventing light reflection of the conductive pattern layer. Therefore, the conductive structure body according to the exemplary embodiment of the present application has excellent visibility by improving a concealing property of the conductive pattern layer.

Moreover, a touch screen panel having improved visibility and a display device and a solar battery including the same can be developed by using the conductive structure body according to the exemplary embodiment of the present application.

EXPLANATION OF REFERENCE NUMERALS AND SYMBOLS

100: Base
200: Darkening pattern layer
220: Darkening pattern layer
300: Conductive pattern layer

BEST MODE

In the present application, it will be understood that when an element is referred to as being positioned "on" another element, the element can be in contact with the other element or intervening elements may also be present between the two elements.

In the present application, unless explicitly described to the contrary, the word "comprise" and variations such as "comprises" or "comprising", will be understood to imply the further inclusion of other elements, not the exclusion of any other elements.

Hereinafter, the present application will be described in more detail.

In the present specification, a display device refers to all monitors for a TV or a computer, and includes a display element forming an image and a case supporting the display element.

Examples of the display element may include a plasma display panel (PDP), a liquid crystal display (LCD), an electrophoretic display, a cathode-ray tube (CRT), an OLED display, and the like. An RGB pixel pattern for implementing an image and an additional optical filter may be provided in the display element.

Meanwhile, in connection with a display device, as the spread of smart phones, tablet PCs, and IPTVs is accelerated, a demand for a touch function that uses human hands as a direct input device without a separate input device such as keyboards or remote controllers is growing. Further, a multi-touch function for recognizing a specific point and taking notes is also required.

Currently, most commercially available touch screen panels (TSP) are based on a transparent conductive ITO thin film, but have problems in that a touch recognition speed is decreased and an additional compensation chip for overcoming the decrease of the touch recognition speed should be introduced because of a RC delay due to relatively high surface resistance of the ITO transparent electrode (minimum 150 Ω/square, ELECRYSTA products manufactured by Nitto Denko Co., Ltd.) when a touch screen panel having a large area is applied.

The inventors of the present application have studied a technology for replacing the transparent ITO thin film by a metal fine pattern having a surface resistance value of a level of several Ω/square. In this regard, the inventors of the present application found problems in that in the case where Ag, Mo/Al/Mo, MoTi/Cu, and the like, which are metal thin films having high electric conductivity, are used as an electrode of a touch screen panel, when a fine electrode pattern having a predetermined shape is to be implemented, the pattern is easily recognized by the human eye in view of visibility due to high reflectance, and glaring and the like may occur due to high reflectance and haze value to external light.

The inventors of the present application found the fact that light reflection and diffraction properties by the patterned layers significantly affect visibility of a conductive metal fine pattern in a touch screen panel including the conductive metal fine pattern provided in an effective screen portion, and tried to improve this. Specifically, the present inventors found that a problem caused by the reflectance of the conductive pattern due to high transmittance of the ITO was not serious in an existing ITO-based touch screen panel, but reflectance and darkening properties of the conductive metal fine pattern were important in the touch screen panel including the conductive metal fine pattern provided in the effective screen portion.

In order to solve the aforementioned problems, the present application provides a conductive structure body that may be differentiated from an existing touch screen panel using an ITO-based transparent conductive thin film layer and has an improved concealing property of a metal fine pattern electrode and improved reflection and diffraction properties to external light. Moreover, in the case where a conductive laminate according to the exemplary embodiment of the present application is applied to a display portion of an electronic device such as the touch screen panel, excellent conductivity and visibility may be secured.

The exemplary embodiment of the present application provides a conductive structure body including: a substrate; a conductive pattern layer provided on the substrate; and a darkening pattern layer provided on at least one surface of the conductive pattern layer, in which the darkening pattern layer includes a copper-manganese-based material represented by $Cu_aMn_bO_cN_d$.

In the copper-manganese-based material, b is a mass ratio of Mn to the copper-manganese-based material and 0.01 or more and 0.5 or less, c is a mass ratio of O to the copper-manganese-based material and 0.05 or more and 0.6 or less, d is a mass ratio of N to the copper-manganese-based material and 0 or more and 0.15 or less, and a is a mass ratio of Cu to the copper-manganese-based material and a remainder value to a sum of the mass ratios of components other than Cu.

In the present specification, the term "conductivity" means electric conductivity.

Further, in the present specification, the term "reflectance" means light reflectance, and the term "refractive index" means a light refractive index.

A total sum of a to d in the copper-manganese-based material may be 1, and a value of a may mean a remaining mass ratio other than the mass ratios of Mn, O, and N in the copper-manganese-based material.

According to the exemplary embodiment of the present application, the copper-manganese-based material may not include N. Specifically, according to the exemplary embodiment of the present application, in the copper-manganese-based material, d may be 0 and c may be 0.25 or more and 0.6 or less.

According to the exemplary embodiment of the present application, in the case where the copper-manganese-based material does not include N, the mass ratio c of O in the copper-manganese-based material may be 0.25 or more and 0.6 or less. Specifically, in the case where the copper-manganese-based material does not include N, the mass ratio c of O in the copper-manganese-based material may be 0.3 or more and 0.55 or less.

There is a problem in that in the case where the copper-manganese-based material does not include N, when the mass ratio c of O is less than 0.25, a region where reflectance is high under a high temperature condition of 150° C. occurs to reduce a darkening effect.

According to the exemplary embodiment of the present application, the copper-manganese-based material may include N. Specifically, according to the exemplary embodiment of the present application, in the copper-manganese-based material, d may be more than 0 and 0.15 or less. To be more specific, according to the exemplary embodiment of the present application, in the copper-manganese-based material, d may be more than 0 and 0.11 or less.

According to the exemplary embodiment of the present application, in the copper-manganese-based material, d may be more than 0 and 0.15 or less, and c+d may be 0.15 or more and 0.6 or less. Specifically, in the case where the copper-manganese-based material includes N, the mass ratio c of O may be 0.05 or more and less than 0.6. Specifically, according to the exemplary embodiment of the present application, in the copper-manganese-based material, d may be more than 0 and 0.15 or less, and c+d may be 0.18 or more and 0.55 or less. Further, according to the exemplary embodiment of the present application, in the copper-manganese-based material, d may be more than 0 and 0.15 or less, and c+d may be 0.25 or more and 0.52 or less.

In the case where the copper-manganese-based material includes N, even though the mass ratio of O is included in the range of less than 0.25, a darkening property may be maintained even under the high temperature condition of 150° C. Specifically, even though the mass ratio of O in the copper-manganese-based material is less than 0.25, in the case where a sum of content ratios of O and N is in the range of 0.15 or more and 0.6 or less, the darkening property of the darkening pattern layer may be maintained well at high temperatures, and moreover, a color change of the darkening pattern layer hardly occurs at high temperatures.

According to the exemplary embodiment of the present application, the darkening pattern layer may be formed through a deposition process. In this case, since CuMn is used as a source material of the deposition process, the darkening pattern layer includes the copper-manganese-based material, and a content of Mn in CuMn may be 10 mass % to 50 mass %. Specifically, according to the exemplary embodiment of the present application, in the case where the darkening pattern layer including the copper-manganese-based material is formed through the deposition process, the mass ratio of Mn in the copper-manganese-based material may have a value of 0.1 or more and 0.5 or less. According to the exemplary embodiment of the present application, the content of Mn of CuMn that is a source material of the deposition process may be adjusted according to the ratio of O and N of the copper-manganese-based material.

According to the exemplary embodiment of the present application, if the value of a to d is satisfied, a bonding type between elements and molecules in the copper-manganese-based material is not limited.

According to the touch screen panel according to the exemplary embodiment of the present application, the darkening pattern layer may be introduced in order to reduce reflectance of the conductive metal fine pattern and improve an absorbance property. The darkening pattern layer may be provided on at least one surface of the conductive pattern layer in the touch screen panel to largely improve a reduction in visibility according to high reflectance of the conductive pattern layer.

Specifically, since the darkening pattern layer has high absorbance, a quantity of light that is incident on the conductive pattern layer and light reflected from the conductive pattern layer may be reduced. Accordingly, reflection according to the conductive pattern layer may be reduced to relieve or remove a glare phenomenon. Thereby, since reflectance of light may be reduced as compared to the case where the user directly observes the conductive pattern layer, visibility of the conductive pattern layer may be largely improved.

In the present specification, the darkening pattern layer means a layer capable of having absorbance to reduce the quantity of light that is incident on the conductive pattern layer and light that is reflected from the conductive pattern layer, and may be represented by terms such as a darkening layer, a light absorption layer, a blackened layer, and a blackening layer.

Further, the darkening pattern layer is formed of a darkening pattern, and the conductive pattern layer is formed of a conductive pattern. The darkening pattern of the darkening pattern layer may be represented by terms such as a light absorption pattern, a blackened pattern, and a blackening pattern. Further, the shape of the pattern will be described below.

In the conductive structure body according to the exemplary embodiment of the present application, an extinction coefficient k of the darkening pattern layer may be 0.2 or more and 2.5 or less, preferably 0.4 or more and 1.2 or less, and more preferably 0.5 or more and 1.1 or less.

The extinction coefficient k may be a value measured in a visible ray wavelength region, and the visible ray region means a region having a wavelength of 380 nm or more and 780 nm or less.

If the extinction coefficient k is 0.2 or more, there is an effect facilitating darkening. The extinction coefficient k may be called an absorption coefficient, and is an index defining how strong the conductive structure body absorbs light at a predetermined wavelength and a factor determining transmittance of the conductive structure body. For example, in the case of a transparent dielectric material, k<0.2, which is very low. However, as the amount of metal components in the material is increased, the k value is increased. If the amount of the metal components is increased to a predetermined amount or more, transmission hardly occurs, mostly, only surface reflection occurs on metal, and the extinction coefficient k is more than 2.5, which is not preferable in formation of the darkening pattern layer.

According to the exemplary embodiment of the present application, the refractive index of the darkening pattern layer of the conductive structure body may be 0 or more and 3 or less, preferably 2 or more and 3 or less, and more preferably 2.2 or more and 2.8 or less.

The refractive index may be a value measured in the visible ray wavelength region, and the visible ray region means a region having a wavelength of 380 nm or more and 780 nm or less.

According to the exemplary embodiment of the present application, when a metal is deposited in order to form the darkening pattern layer, the extinction coefficient k and the refractive index n relating to extinction interference are important factors. If the high extinction coefficient and the low refractive index are secured, ultimately, reflectance may be reduced to reduce visibility.

In the conductive structure body according to the exemplary embodiment of the present application, the extinction coefficient k value may be increased and reflectance may be reduced by adding manganese (Mn), which is a metal, to the copper (Cu)-based darkening pattern layer. Moreover, in the case where manganese (Mn) is included, corrosion of copper may be prevented to increase durability of the darkening pattern layer.

In the exemplary embodiment of the present application, total reflectance of the conductive structure body may be 25% or less.

The total reflectance may be a value measured in the visible ray wavelength region, and the visible ray region means a region having a wavelength of 380 nm or more and 780 nm or less.

Specifically, the total reflectance of the conductive structure body may be 20% or less with respect to light having at least one wavelength among lights having a wavelength of 600 nm or more and 750 nm or less, and more specifically 15% or less with respect to light having at least one wavelength among lights having a wavelength of 600 nm or more and 750 nm or less. Alternatively, average total reflectance of the conductive structure body may be 20% or less in the wavelength region of 600 nm or more and 750 nm or less. As the total reflectance is reduced, a darkening effect is more excellent.

The total reflectance may be measured in a direction of a surface opposite to a surface on which the darkening pattern is in contact with the conductive pattern. When measurement is performed in this direction, total reflectance may be 20% or less with respect to light having at least one wavelength among lights having a wavelength of 600 nm or more and 750 nm or less, and more specifically 15% or less with respect to light having at least one wavelength among lights having a wavelength of 600 nm or more and 750 nm or less. Alternatively, average total reflectance of the conductive structure body may be 20% or less in the wavelength region of 600 nm or more and 750 nm or less.

Further, the darkening pattern may be provided between the conductive pattern and the substrate, and measurement may be performed at a substrate side. When the total reflectance is measured at the substrate side, the total reflectance may be 20% or less with respect to light having at least one wavelength among lights having a wavelength of 600 nm or more and 750 nm or less, and more specifically 15% or less with respect to light having at least one wavelength among lights having a wavelength of 600 nm or more and 750 nm or less. Alternatively, average total reflectance of the conductive structure body may be 20% or less in the wavelength region of 600 nm or more and 750 nm or less.

According to the exemplary embodiment of the present specification, the conductive pattern layer may be provided between the substrate and the darkening pattern layer, and the total reflectance may be measured on a surface of the substrate, on which the conductive pattern is provided. Specifically, in the case where the surface of the substrate, on which the conductive pattern layer is formed, is observed from the outside, a glare effect of the conductive pattern layer may be blocked by the darkening pattern layer.

According to the exemplary embodiment of the present application, the darkening pattern layer may be provided between the substrate and the conductive pattern layer, and the total reflectance may be measured on an opposite surface of the surface of the substrate, on which the conductive pattern is provided. Specifically, in the case where the lower surface of the substrate, on which the conductive pattern layer is not formed, is observed from the outside, the glare effect of the conductive pattern layer may be blocked by the darkening pattern layer.

Generally, when total reflectance is 25% or less, it is difficult to recognize the surface by the human eye, and visibility is low. Accordingly, the conductive structure body including the darkening pattern layer according to the exemplary embodiment of the present application may have an effect where visibility is low by reducing a glare recognized by the human eye by reflection from the conductive pattern layer of the conductive structure body. That is, as total reflectance of the conductive structure body is reduced, visibility of the conductive pattern layer is reduced, and thus efficiency of the darkening pattern layer may be increased.

In the conductive structure body according to the exemplary embodiment of the present application, the darkening pattern layer may include a first surface that is in contact with the conductive pattern layer, and a second surface that faces the first surface. When total reflectance of the conductive structure body is measured at a second surface side of the darkening pattern layer, total reflectance Rt of the conductive structure body may be calculated by the following Equation 1.

Total reflectance (Rt)=total reflectance of substrate+ closure ratio×total reflectance of darkening pattern layer [Equation 1]

Further, in the case where the conductive structure body is configured so that two kinds of conductive structure bodies are laminated, total reflectance Rt of the conductive structure body may be calculated by the following Equation 2.

Total reflectance (Rt)=total reflectance of substrate+ closure ratio×total reflectance of darkening pattern layer×2 [Equation 2]

In Equations 1 and 2, the total reflectance of the substrate may be total reflectance of a touch reinforced glass, and in the case where the surface is a film, total reflectance of the substrate may be total reflectance of the film.

Further, the closure ratio may be represented by an area ratio of a region covered by the conductive pattern, that is, (1−opening ratio), based on a plane of the conductive structure body.

Accordingly, a difference between the case where there is the darkening pattern layer and the case where there is no darkening pattern layer depends on total reflectance of the darkening pattern layer. In this regard, total reflectance Rt of the conductive structure body according to the exemplary embodiment of the present application may be reduced by 10% or more and 20% or less, 20% or more and 30% or less, 30% or more and 40% or less, 40% or more and 50% or less, or 50% or more and 70% or less, as compared to total reflectance R0 of the conductive structure body having the same constitution, except that there is no darkening pattern layer. That is, in the case where in Equations 1 and 2, while the closure ratio is changed in the range of 1% or more and 10% or less, the total reflectance is changed in the range of 1% or more and 30% or less, a maximum total reflectance reduction effect of 70% may be exhibited, and a minimum total reflectance reduction effect of 10% may be exhibited.

In the conductive structure body according to the exemplary embodiment of the present application, the darkening pattern layer includes a first surface that is in contact with the conductive pattern, and a second surface that faces the first surface, and when that total reflectance of the conductive structure body is measured at the second surface side of the darkening pattern, a difference between total reflectance Rt of the conductive structure body and total reflectance R0 of the substrate may be 40% or less, 30% or less, 20% or less, or 10% or less.

According to the exemplary embodiment of the present application, a brightness value L* of the conductive structure body may be 55 or less based on a CIE (Commission Internationale de l'Eclairage) L*a*b* color coordinate. As brightness L* is reduced, reflectance is reduced to provide an advantageous effect.

According to the exemplary embodiment of the present application, chromaticity a* and b* of the conductive structure body may be each 0 or less based on the CIE (Commission Internationale de l'Eclairage) L*a*b* color coordinate. Chromaticity a* and b* represent hue and chroma, and as chromaticity a* and b* are reduced, reflectance is reduced to provide an advantageous effect.

According to the exemplary embodiment of the present application, the conductive structure body including the conductive pattern layer and the darkening pattern layer may have surface resistance of more than 0 Ω/square and 300 Ω/square or less, specifically 1 Ω/square or more and 100 Ω/square or less, more specifically 1 Ω/square or more and 50 Ω/square or less, and even more specifically 1 Ω/square or more and 20 Ω/square or less.

If surface resistance of the conductive structure body is more than 0 Ω/square and 300 Ω/square or less, there is an effect of replacing an existing ITO transparent electrode. In the case where surface resistance of the conductive structure body is 1 Ω/square or more and 100 Ω/square or less or 1 Ω/square or more and 50 Ω/square or less, and particularly, in the case where surface resistance of the conductive structure body is 1 Ω/square or more and 20 Ω/square or less, since surface resistance is significantly low as compared to the case where the existing ITO transparent electrode is used, a RC delay is reduced when a signal is applied, so as to significantly improve a touch recognition speed, and based on this, it is easy to apply the conductive structure body to a touch screen having a large area of 7 inches or more.

In the conductive structure body, surface resistance of the conductive pattern layer or the darkening pattern layer before patterning may be more than 0 Ω/square and 2 Ω/square or less, and specifically more than 0 Ω/square and 0.7 Ω/square or less. As surface resistance of the conductive pattern layer or the darkening pattern layer before patterning is reduced, fine patterning designing and manufacturing processes are easily performed, and surface resistance of the conductive structure body after patterning is reduced, and thus there is an effect of increasing a reaction speed of an electrode. The surface resistance may be adjusted according to the thickness of the conductive pattern layer or the darkening pattern layer.

According to the exemplary embodiment of the present application, the thickness of the darkening pattern layer may be 20 nm or more and 100 nm or less, specifically 25 nm or more and 100 nm or less, and more specifically 30 nm or more and 80 nm or less. A preferable thickness of the darkening pattern layer may be changed according to a used material and a manufacturing process. Specifically, in consideration of the case where the darkening pattern layer is formed through an etching process, if the thickness is less than 20 nm, it may be not easy to adjust a process, and if the thickness is more than 100 nm, there may be a disadvantage in terms of a production speed.

Specifically, in the case where the thickness of the darkening pattern layer is 25 nm or more and 100 nm or less and more specifically 30 nm or more and 80 nm or less, it is easy to adjust the process and the production speed is improved, and thus there may be a further advantage in the manufacturing process. In this case, reflectance is further reduced to form the darkening pattern layer more well, and thus there is a further advantageous effect.

In the exemplary embodiment of the present application, the darkening pattern layer may further include at least one of a dielectric material and a metal. Examples of the dielectric material may include SiO, $SiO_2$, $MgF_2$, SiNx (x is an integer of 1 or more), and the like, but are not limited thereto. Examples of the metal may include Fe, Co, Ti, V, Al, Au, Ag, and the like, but are not limited thereto. According to the exemplary embodiment of the present application, the darkening pattern layer may further include one kind or more of the dielectric materials and one kind or more of the metals.

According to the exemplary embodiment of the present application, it is preferable that the dielectric material be distributed so that an amount of the dielectric material is gradually reduced as the dielectric material becomes more distant from an incident direction of external light and the metal be distributed in an opposite manner thereof. In this case, the content of the dielectric material may be 20 wt % or more and 50 wt % or less, and the content of the metal may be 50 wt % or more and 80 wt % or less.

In the conductive structure body according to the exemplary embodiment of the present application, a transparent board may be used as the substrate, but the substrate is not particularly limited, and for example, glass, a plastic board, a plastic film, and the like may be used.

Specifically, the plastic may be polyethylene terephthalate (PET), polycarbonate (PC), or polyamide (PA).

In the exemplary embodiment of the present application, the thickness of the conductive pattern layer is not particularly limited, but when the thickness is 0.01 μm or more and 10 μm or less, a more excellent effect may be exhibited in terms of conductivity of the conductive pattern layer and economic feasibility of the process of forming the pattern.

According to the exemplary embodiment of the present application, the thickness of the conductive pattern layer may be 0.01 μm or more and 10 μm or less.

According to the exemplary embodiment of the present application, it is appropriate that a material of the conductive pattern layer is a material having specific resistance of $1 \times 10^6$ Ω·cm or more and $30 \times 10^6$ Ω·cm or less, and preferably, the specific resistance may be $1 \times 10^6$ Ω·cm or more and $7 \times 10^6$ Ω·cm or less.

Specifically, according to the exemplary embodiment of the present application, the conductive pattern layer may include one or more materials selected from the group consisting of a metal, a metal alloy, a metal oxide, and a metal nitride, and the materials may have specific resistance of $1 \times 10^6$ Ω·cm or more and $30 \times 10^6$ Ω·cm or less.

In the conductive structure body according to the exemplary embodiment of the present application, it is preferable that the material of the conductive pattern layer include one kind or more of the metal, the metal alloy, the metal oxide, and the metal nitride. It is good that the material of the conductive pattern layer is a metallic material that has excellent electric conductivity and is easily etched. However, in general, the material having excellent electric conductivity has high reflectance. However, in the present application, the conductive pattern layer may be formed using the material having high reflectance by using the darkening pattern layer. In the present application, even in the case where the material having reflectance of 70 to 80% or more is used, the darkening pattern layer may be added to reduce reflectance, improve a concealing property of the conductive pattern layer, and maintain or improve a contrast property.

According to the exemplary embodiment of the present application, the conductive pattern layer may include one or more selected from the group consisting of copper, aluminum, silver, neodymium, molybdenum, nickel, an alloy including two or more thereof, oxide including one or more thereof, and nitride including one or more thereof. Specifically, according to the exemplary embodiment of the present application, the conductive pattern layer may include copper.

According to the exemplary embodiment of the present application, the conductive pattern layer may be a single or multilayered structure.

In the case where the conductive pattern layer includes copper, since the conductive pattern layer can be subjected to batch etching together with the darkening layer including copper, production process efficiency is high and a cost is reduced, which is economical.

Further, since a specific resistance value of copper is $1.7 \times 10^{-6}$ cm, copper is better than Al having a specific resistance value of $2.8 \times 10^{-6}$ cm. Therefore, in the case where copper is used in order to form the conductive pattern layer satisfying a surface resistance value of more than 0 Ω/square and 2 Ω/square or less and preferably more than 0 Ω/square and 0.7 Ω/square or less, copper may be more thinly formed as compared to Al. The surface resistance may be adjusted according to the thickness of the conductive pattern layer. For example, in order to satisfy surface resistance of 0.6 Ω/square or more and 0.7 Ω/square or less, in the case of Al, surface resistance should be 80 nm or more and 90 nm or less, but in the case of Cu, surface resistance should be 55 nm or more and 65 nm or less, and thus the layer may be formed in a smaller thickness, which is economical.

Further, since Cu has a yield that is better than that of Al by about 2.5 times in a sputtering process, theoretically, improvement in deposition speed of 4 times to 5 times may be expected. Therefore, in the production process, the conductive pattern layer including Cu has high efficiency and is economical and thus is excellent.

In the exemplary embodiment of the present application, the darkening pattern layer may be provided on any one surface or both surfaces of the conductive pattern layer. Specifically, the darkening pattern layer may be provided on an upper surface, a lower surface, or both the upper surface and the lower surface of the conductive pattern layer.

According to the exemplary embodiment of the present application, the darkening pattern of the darkening pattern layer and the conductive pattern of the conductive pattern layer may be simultaneously or separately patterned.

According to the exemplary embodiment of the present application, the darkening pattern layer and the conductive pattern layer may form a laminate structure by a simultaneous or separate patterning process. In this regard, the laminate structure may be differentiated from a structure where at least a portion of a light absorption material is incorporated or dispersed in the conductive pattern, or a structure where a portion at a surface side of the conductive pattern of the single layer is physically or chemically deformed by additional surface treatment.

Further, in the conductive structure body according to the exemplary embodiment of the present application, the darkening pattern layer may be directly provided on the substrate or the conductive pattern layer while an attachment layer or an adhesive layer is not interposed therebetween. The attachment layer or the adhesive layer may affect durability or optical properties. Further, a method for manufacturing the conductive structure body according to the exemplary embodiment of the present application is significantly different from that of the case where the attachment layer or the adhesive layer is used. Moreover, as compared to the case where the attachment layer or the adhesive layer is used, the conductive structure body according to the exemplary embodiment of the present application has an excellent interface property between the substrate or the conductive pattern layer and the darkening pattern layer.

According to the exemplary embodiment of the present application, the darkening pattern layer may be formed of a single layer, or a plurality of layers of two or more layers.

According to the exemplary embodiment of the present application, it is preferable that the darkening pattern layer have an achromatic color-based hue. In this case, the achromatic color-based hue means a color exhibited when light that is incident on a surface of a body is not selectively absorbed but reflected and absorbed uniformly to a wavelength of each component.

The darkening pattern layer is formed of a darkening pattern, and the conductive pattern layer is formed of a conductive pattern. Herein, the darkening pattern of the darkening pattern layer and the conductive pattern of the conductive pattern layer may be patterns having the same shape. However, the range of the darkening pattern may not be completely identical to that of the conductive pattern, and the case where a line width of the darkening pattern is narrower or wider than the line width of the conductive pattern is also included in the range of the present application.

According to the exemplary embodiment of the present application, the darkening pattern may have a pattern shape having the line width that is smaller or larger than that of the conductive pattern. For example, the line width of the darkening pattern may be 80% or more and 120% or less of the line width of the conductive pattern.

Further, an area where the pattern is provided in the darkening pattern layer may be 80% or more and 120% or less of the area where the pattern is provided in the conductive pattern layer. That is, the area of the darkening pattern may be 80% or more and 120% or less of the area of the conductive pattern.

According to the exemplary embodiment of the present application, it is preferable that the darkening pattern have a pattern shape having the line width that is the same as or larger than the line width of the conductive pattern.

In the case where the darkening pattern has the line width that is larger than the line width of the conductive pattern, since an effect in which the darkening pattern covers the conductive pattern when observed by the user may be more largely provided, an effect by gloss or reflection of the conductive pattern may be efficiently blocked. However, even though the line width of the darkening pattern is the same as the line width of the conductive pattern, a target effect of the present application can be achieved.

In the exemplary embodiment of the present application, the line width of the conductive pattern may be more than 0 μm and 10 μm or less, specifically 0.1 μm or more and 10 μm or less, more specifically 0.2 μm or more and 8 μm or less, and even more specifically 0.5 μm or more and 5 μm or less.

In the exemplary embodiment of the present application, the opening ratio of the conductive pattern layer, that is, the ratio of the area not covered by the pattern, may be 70% or more, 85% or more, or 95% or more. Further, the opening ratio of the conductive pattern layer including the conductive pattern may be 90% or more and 99.9% or less, but is not limited thereto.

In the exemplary embodiment of the present application, the conductive pattern may be a regular pattern or an irregular pattern.

A pattern shape of the art, such as a mesh pattern, may be used as the regular pattern. The irregular pattern is not particularly limited, but may be a boundary line shape of figures constituting a Voronoi diagram. In the present application, in the case where the darkening pattern layer is irregular, a diffraction pattern of reflected light by lighting having directivity may be removed by the irregular pattern, and an effect by scattering of light may be minimized by the darkening pattern layer, and thus the problem in visibility may be minimized.

Figure 1:
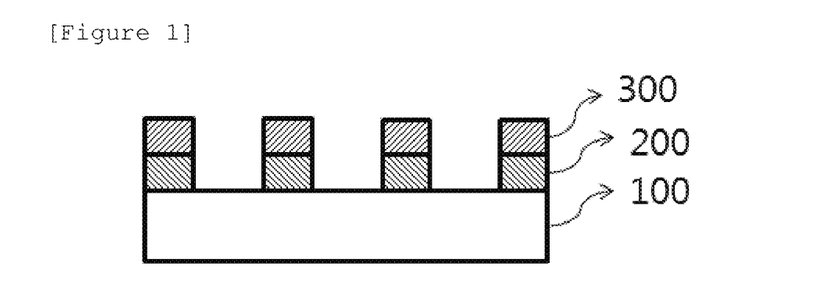
FIGS. 1 to 3 illustrate a laminate structure of a conductive structure body according to an exemplary embodiment of the present application.
Figure 2:
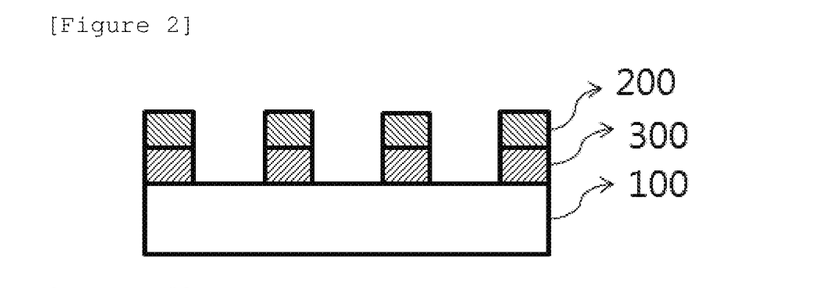
Figure 3:
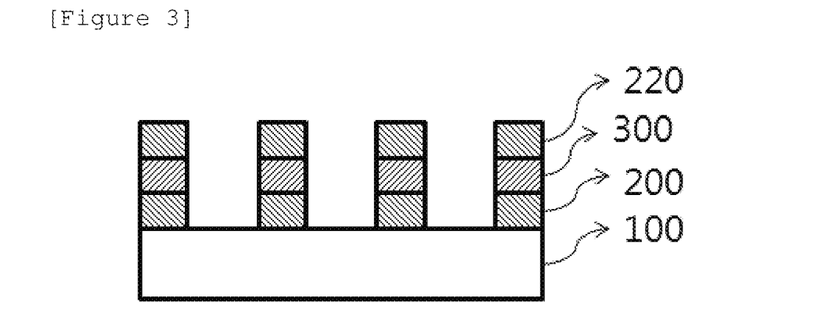

FIGS. 1 to 3 illustrate a laminate structure of the conductive structure body according to the exemplary embodiment of the present application. FIGS. 1 to 3 illustrate the order of lamination of the conductive pattern layer and the darkening pattern layer, and the conductive pattern layer and the darkening pattern layer may not be an entire surface layer but a pattern type when being actually applied as a fine transparent electrode such as a touch screen panel.

According to FIG. 1, the case where a darkening pattern layer 200 is disposed between a substrate 100 and a conductive pattern layer 300 is illustrated. The configuration may large reduce reflectance by the conductive pattern layer in the case where the user observes the touch screen panel from the substrate side.

According to FIG. 2, the case where the darkening pattern layer 200 is disposed on the conductive pattern layer 300 is illustrated. The configuration may largely reduce reflectance by the conductive pattern layer in the case where the user observes the touch screen panel from an opposite surface of the substrate side.

According to FIG. 3, the case where the darkening pattern layers 200 and 220 are disposed between the substrate 100 and the conductive pattern layer 300 and on the conductive pattern layer 300 is illustrated. The configuration may largely reduce reflectance by the conductive pattern layer in all of the case where the user observes the touch screen panel from the substrate side and the case where the user observes the touch screen panel from the opposite side thereof.

The conductive structure body according to the exemplary embodiment of the present application may have a structure where the darkening pattern layer is provided on at least one surface of the conductive pattern layer.

The structure of the conductive structure body according to the exemplary embodiment of the present application may be a structure where the substrate, the darkening pattern layer, the conductive pattern layer, and the darkening pattern layer are sequentially laminated. Further, the conductive structure body may include an additional conductive pattern layer and an additional darkening pattern layer on the outermost darkening pattern layer.

That is, the structure of the conductive structure body according to the exemplary embodiment of the present application may be a structure of substrate/darkening pattern layer/conductive pattern layer, a structure of substrate/conductive pattern layer/darkening pattern layer, a structure of substrate/darkening pattern layer/conductive pattern layer/darkening pattern layer, a structure of substrate/conductive pattern layer/darkening pattern layer/conductive pattern layer, a structure of substrate/darkening pattern layer/conductive pattern layer/darkening pattern layer/conductive pattern layer/darkening pattern layer, a structure of substrate/darkening pattern layer/conductive pattern layer/darkening pattern layer/conductive pattern layer/darkening pattern layer/conductive pattern layer/darkening pattern layer, or the like.

In the above description, the conductive pattern layer may include the conductive pattern, and the darkening pattern layer may include the darkening pattern.

The exemplary embodiment of the present application provides a touch screen panel including the conductive structure body. For example, in a capacitance type touch screen panel, the conductive structure body according to the exemplary embodiment of the present application may be used as a touch-sensitive type electrode board.

An exemplary embodiment of the present application provides a display device including the touch screen panel.

The touch screen panel according to the exemplary embodiment of the present application may further include an additional structure body in addition to the aforementioned conductive structure body including the substrate, the conductive pattern layer, and the darkening pattern layer. In this case, two structure bodies may be disposed in the same direction, or two structure bodies may be disposed in directions that are opposite to each other. Two or more structure bodies that may be included in the touch screen panel of the present application may not have the same structure, and only any one and preferably the structure body that is closest to the user may include the substrate, the conductive pattern layer, and the darkening pattern layer, and the additionally included structure body may not include the darkening pattern layer. Further, layer laminate structures in two or more structure bodies may be different from each other. In the case where two or more structure bodies are included, an insulation layer may be provided therebetween. In this case, the insulation layer may further have a function of an adhesive layer.

The touch screen panel according to the exemplary embodiment of the present application may include a lower substrate; an upper substrate; and an electrode layer provided on any one surface of a surface of the lower substrate that is in contact with the upper substrate and a surface of the upper substrate that is in contact with the lower substrate or both the surfaces thereof. The electrode layer may have X axis and Y axis position detection functions.

In this case, one or two of the electrode layer provided on the lower substrate and the surface of the lower substrate that is in contact with the upper substrate; and the electrode layer provided on the upper substrate and the surface of the upper substrate that is in contact with the lower substrate may be the conductive structure body according to the exemplary embodiment of the present application. In the case where only any one of the electrode layers is the conductive structure body according to the present application, the other one may have a conductive pattern known in the art.

In the case where the electrode layer is provided on one surface of both the upper substrate and the lower substrate to form a double-layered electrode layer, an insulating layer or a spacer may be provided between the lower substrate and the upper substrate so as to constantly maintain an interval between the electrode layers and prevent connection therebetween. The insulation layer may include an adhesive or a UV or heat curable resin.

The touch screen panel may further include a ground portion connected to the conductive pattern of the conductive structure bodies. For example, the ground portion may be formed at an edge portion of the surface on which the conductive pattern of the substrate is formed. Further, at least one of an antireflection film, a polarizing film, and a fingerprint resistant film may be provided on at least one surface of the laminate including the conductive structure body. Other kinds of functional films may be further included in addition to the aforementioned functional films according to the design specification.

The touch screen panel may be applied to display devices such as an OLED display panel, a liquid crystal display (LCD), a cathode-ray tube (CRT), and a plasma display panel (PDP).

In the touch screen panel according to the exemplary embodiment of the present application, the conductive pattern layer and the darkening pattern layer may be provided on both surfaces of the substrate, respectively.

The touch screen panel according to the exemplary embodiment of the present application may further include an electrode portion or a pad portion on the conductive structure body. In this case, the effective screen portion, the electrode portion, and the pad portion may be formed of the same conductor.

In the touch screen panel according to the exemplary embodiment of the present application, the darkening pattern layer may be provided at a side observed by a user.

An exemplary embodiment of the present application provides a display device including the conductive structure body. In the display device, the conductive structure body according to the exemplary embodiment of the present application may be used in a color filter board, a thin film transistor board, or the like.

An exemplary embodiment of the present application provides a solar battery including the conductive structure body. For example, the solar battery may include an anode electrode, a cathode electrode, a photoactive layer, a hole transport layer, and/or an electron transport layer, and the conductive structure body according to the exemplary embodiment of the present application may be used as the anode electrode and/or the cathode electrode.

The conductive structure body may replace existing ITO in the display device or the solar battery, and flexibility thereof may be used. Further, the conductive structure body may be used as a next generation transparent electrode together with CNT, conductive polymers, graphene and the like.

An exemplary embodiment of the present application provides a method for manufacturing the conductive structure body. Specifically, the exemplary embodiment of the present application provides a method for manufacturing a conductive structure body, including: preparing a substrate; forming a conductive pattern layer on the substrate; and forming a darkening pattern layer on an upper surface, a lower surface, or the upper surface and the lower surface of the conductive pattern layer, in which the darkening pattern layer includes a copper-manganese-based material represented by $Cu_aMn_bO_cN_d$.

a to d in the copper manganese-based material are the same as those described in the above.

According to the exemplary embodiment of the present application, the forming of the conductive pattern layer may include forming a conductive layer on the substrate, wherein the forming of the darkening pattern layer may include forming a darkening layer on an upper surface, a lower surface, or the upper surface and the lower surface of the conductive layer, and the conductive pattern layer and the darkening pattern layer may be formed by simultaneous patterning of the conductive layer and the darkening layer.

The conductive layer includes a material constituting the conductive pattern layer, and means a layer formed before the conductive pattern layer is patterned.

The darkening layer includes a material constituting the darkening pattern layer, and means a layer formed before the darkening pattern layer is patterned.

According to the exemplary embodiment of the present specification, the simultaneous patterning may be batch etching using an etchant.

According to the exemplary embodiment of the present application, the method for manufacturing the conductive structure body may include forming a darkening pattern layer on a substrate, and forming a conductive pattern layer after the darkening pattern layer is formed.

According to the exemplary embodiment of the present application, the method for manufacturing the conductive structure body may include forming a conductive pattern layer on a substrate, and forming a darkening pattern layer after the conductive pattern layer is formed.

According to the exemplary embodiment of the present application, the method for manufacturing the conductive structure body may further include forming a darkening pattern layer on a substrate, forming a conductive pattern layer after the darkening pattern layer is formed, and forming a darkening pattern layer after the conductive pattern layer is formed.

An exemplary embodiment of the present application provides a method for manufacturing a conductive structure body, including forming a conductive layer on a substrate; forming a darkening layer including a copper-manganese-based material before, after, or before and after the conductive layer is formed; and individually or simultaneously patterning the conductive layer and the darkening layer.

In the exemplary embodiment of the present application, the method for manufacturing the conductive structure body may include forming a conductive layer on a substrate, patterning the conductive layer, forming a darkening layer on the patterned conductive layer, and patterning the darkening layer.

According to the exemplary embodiment of the present application, the method for manufacturing the conductive structure body may include forming a conductive layer on a substrate, forming a darkening layer on the conductive layer, and simultaneously patterning the two layers.

According to the exemplary embodiment of the present application, the method for manufacturing the conductive structure body may include forming a darkening layer on a substrate, patterning the darkening layer, forming a conductive layer on the patterned darkening layer, and patterning the conductive layer.

According to the exemplary embodiment of the present application, the method for manufacturing the conductive structure body may include forming a darkening layer on a substrate, forming a conductive layer on the darkening layer, and simultaneously patterning the two layers.

According to the exemplary embodiment of the present application, the method for manufacturing the conductive structure body may include forming a darkening layer on a substrate, patterning the darkening layer, forming a conductive layer on the patterned darkening layer, patterning the conductive layer, and additionally, forming a darkening layer on the patterned conductive layer, and patterning the darkening layer.

According to the exemplary embodiment of the present application, the method for manufacturing the conductive structure body may include forming a darkening layer on a substrate, forming a conductive layer on the darkening layer, forming a darkening layer on the conductive layer, and simultaneously patterning the three layers.

In the method for manufacturing the conductive structure body of the present application, when the darkening layer and the conductive layer are formed of two or more layers, the darkening layer and the conductive layer may be individually or simultaneously patterned.

In the method for manufacturing the conductive structure body, surface resistance of the conductive pattern layer or the darkening pattern layer before patterning may be more than 0 Ω/square and 2 Ω/square or less, and preferably more than 0 Ω/square and 0.7 Ω/square or less. If the surface resistance is 2 Ω/square or less and particularly 0.7 Ω/square or less, as surface resistance of the conductive pattern layer or the darkening pattern layer before patterning is reduced, fine patterning designing and manufacturing processes are easily performed, and surface resistance of the conductive structure body after patterning is reduced, and thus there is an effect of increasing the response speed of the electrode.

In the exemplary embodiment of the present application, in the forming of the darkening layer or the darkening pattern layer, the darkening pattern or the darkening pattern layer may be formed by using a method known in the art. For example, the darkening pattern or the darkening pattern layer may be formed by a method such as deposition, sputtering, wet coating, vaporization, electrolytic plating, electroless plating, and lamination of metal foils, and specifically a sputtering method.

According to the exemplary embodiment of the present application, the forming of the darkening pattern layer may adopt a deposition process. Specifically, after Cu containing Mn is used as a source material to form the darkening layer, the darkening layer may be patterned through an etching process and the like. Further, Cu and Mn may be separately deposited to form the darkening pattern layer. In all of the case where Cu including Mn is used as the source material to perform deposition and the case where Cu and Mn are each used as the source material to perform deposition, etching can be performed by using a Cu etchant. Therefore, in the case where the conductive pattern layer includes Cu, the conductive pattern layer and the darkening pattern layer may be subjected to batch etching by using the Cu etchant to perform patterning through one process. The source material means a target in a sputtering process.

According to the exemplary embodiment of the present specification, in the case where deposition is performed by using the source material of each of Cu and Mn, since a relative ratio of Cu and Mn may be adjusted, adjustment in terms of darkening and durability properties may be easy.

In the case where the deposition process is used, addition of oxygen and nitrogen can be adjusted by introducing a gas under a vacuum atmosphere.

A method for forming the conductive pattern layer is not particularly limited, and the conductive pattern layer may be formed by a direct printing method, or a method for patterning the conductive layer after forming the conductive layer may be used.

According to the exemplary embodiment of the present application, in the case where the conductive pattern layer is formed by the printing method, ink or paste of the conductive material may be used, and the paste may further include a binder resin, a solvent, a glass frit, or the like in addition to the conductive material.

In the case where the conductive layer is patterned after the conductive layer is formed, a material having an etching resist property may be used.

According to the exemplary embodiment of the present application, the conductive pattern layer may be formed by a method such as deposition, sputtering, wet coating, vaporization, electrolytic plating or electroless plating, and lamination of metal foils. A method for applying an organic metal, a nano metal, or a complex solution thereof on a board and then providing conductivity by firing and/or drying may be used as the method for forming the conductive pattern layer. Organic silver may be used as the organic metal, and nano silver particles and the like may be used as the nano metal.

According to the exemplary embodiment of the present application, the conductive pattern may be formed by using a method using an etching resist pattern. The etching resist pattern may be formed by using a printing method, a photolithography method, a photography method, a method using a mask, or laser transferring, for example, thermal transfer imaging or the like, and the printing method or the photolithography method is more preferable, but the method is not limited thereto. The conductive thin film layer may be etched to be patterned by using the etching resist pattern, and the etching resist pattern may be easily removed by a strip process.

Hereinafter, the present application will be described in more detail with reference to Examples, Comparative Examples, and Experimental Examples. However, the following Examples, Comparative Examples, and Experimental Examples are set forth to illustrate the present application, but the scope of the present application is not limited thereto.

EXAMPLE 1

The conductive layer having the thickness of 60 nm was formed on the polyethylene terephthalate (PET) substrate by using the Cu single target by the direct current power source sputtering (DC sputtering) method. The darkening layer having the thickness of 46 nm and including the copper-manganese-based material was formed on the conductive layer by using the Cu—Mn alloy target by the radio frequency sputtering (RF sputtering) method. Moreover, the conductive layer and the darkening layer were patterned through batch etching to manufacture the conductive structure body.

EXAMPLE 2

The conductive layer having the thickness of 60 nm was formed on the polyethylene terephthalate (PET) substrate by using the Cu single target by the direct current power source sputtering (DC sputtering) method. The darkening layer having the thickness of 52 nm and including the copper-manganese-based material was formed on the conductive layer by using the Cu—Mn alloy target by the radio frequency sputtering (RF sputtering) method. Thereafter, the conductive layer and the darkening layer were patterned through batch etching to manufacture the conductive structure body.

EXAMPLE 3

The conductive layer having the thickness of 60 nm was formed on the polyethylene terephthalate (PET) substrate by using the Cu single target by the direct current power source sputtering (DC sputtering) method. The darkening layer having the thickness of 61 nm and including the copper-manganese-based material was formed on the conductive layer by using the Cu—Mn alloy target by the radio frequency sputtering (RF sputtering) method. Thereafter, the conductive layer and the darkening layer were patterned through batch etching to manufacture the conductive structure body.

EXAMPLE 4

The conductive layer having the thickness of 60 nm was formed on the polyethylene terephthalate (PET) substrate by using the Cu single target by the direct current power source sputtering (DC sputtering) method. The darkening layer having the thickness of 70 nm and including the copper-manganese-based material was formed on the conductive layer by using the Cu—Mn alloy target by the radio frequency sputtering (RF sputtering) method. Thereafter, the conductive layer and the darkening layer were patterned through batch etching to manufacture the conductive structure body.

COMPARATIVE EXAMPLE 1

The conductive layer having the thickness of 60 nm was formed on the polyethylene terephthalate (PET) substrate by using the Cu single target by the direct current power source sputtering (DC sputtering) method. The darkening layer including copper oxides and having the thickness of 35 nm was formed on the conductive layer by using the CuO single target by the radio frequency sputtering (RF sputtering) method. Moreover, the conductive layer and the darkening layer were patterned through the etching process to manufacture the conductive structure body.

COMPARATIVE EXAMPLE 2

The conductive layer having the thickness of 60 nm was formed on the polyethylene terephthalate (PET) substrate by using the Cu single target by the direct current power source sputtering (DC sputtering) method. The darkening layer including copper oxides and having the thickness of 50 nm was formed on the conductive layer by using the CuO single target by the radio frequency sputtering (RF sputtering) method. Moreover, the conductive layer and the darkening layer were patterned through the etching process to manufacture the conductive structure body.

COMPARATIVE EXAMPLE 3

The conductive layer having the thickness of 60 nm was formed on the polyethylene terephthalate (PET) substrate by using the Cu single target by the direct current power source sputtering (DC sputtering) method. The darkening layer including copper oxides and having the thickness of 60 nm was formed on the conductive layer by using the CuO single target by the radio frequency sputtering (RF sputtering) method. Moreover, the conductive layer and the darkening layer were patterned through the etching process to manufacture the conductive structure body.

COMPARATIVE EXAMPLE 4

The conductive layer having the thickness of 80 nm was formed on the polyethylene terephthalate (PET) substrate by using the Al single target by the direct current power source sputtering (DC sputtering) method. The darkening layer including copper oxides and having the thickness of 50 nm was formed on the conductive layer by using the CuO single target by the radio frequency sputtering (RF sputtering) method. Moreover, the conductive layer and the darkening layer were patterned through the etching process to manufacture the conductive structure body.

Figure 4:
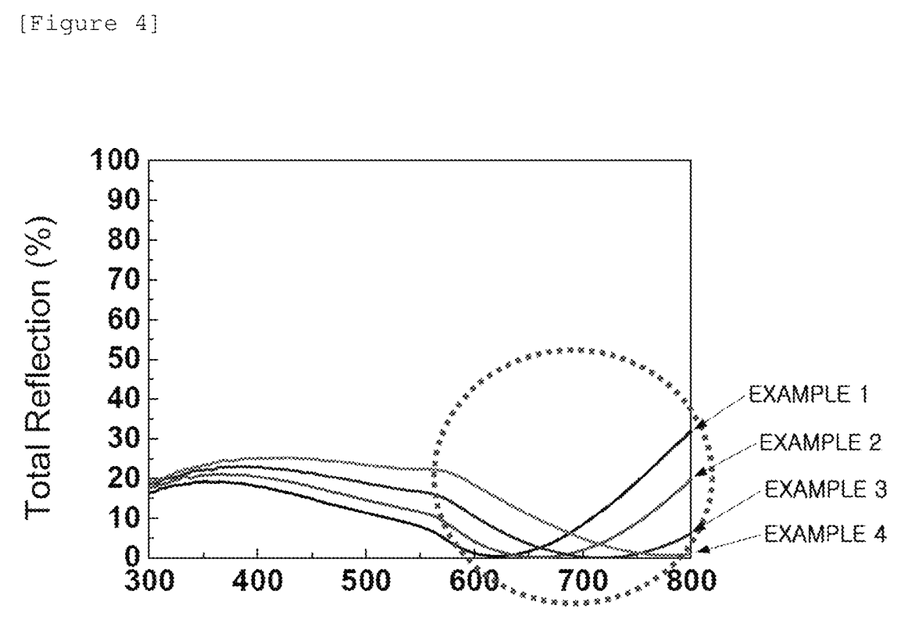
FIG. 4 illustrates a result obtained by measuring total reflectance of conductive structure bodies according to Examples 1 to 4 according to a wavelength of 600 nm or more and 750 nm or less by using Solidspec 3700 (UV-Vis spectrophotometer, Shimadzu Corp.).

FIG. 4 illustrates a result obtained by measuring total reflectance of the conductive structure bodies according to Examples 1 to 4 according to a wavelength of 600 nm or more and 750 nm or less by using Solidspec 3700 (UV-Vis spectrophotometer, Shimadzu Corp.). As seen in FIG. 4, it was measured that the conductive structure bodies according to the Examples had low reflectance, which is the result obtained by reducing reflectance of the conductive pattern layer by the darkening pattern layer.

Moreover, average total reflectance of the conductive structure bodies according to Examples 1 to 4 and Comparative Examples 1 to 4 is described in the following Table 1.

TABLE 1

| Classification | Average total reflectance (%) |
|---|---|
| Example 1 | 6.4 |
| Example 2 | 2.6 |

TABLE 1-continued

| Classification | Average total reflectance (%) |
|---|---|
| Example 3 | 2.9 |
| Example 4 | 5.0 |
| Comparative Example 1 | 25.2 |
| Comparative Example 2 | 21.6 |
| Comparative Example 3 | 18.2 |
| Comparative Example 4 | 23.2 |

As seen in Table 1, it can be seen that total reflectance of the conductive structure bodies according to the Examples is lower than that of the conductive structure bodies according to the Comparative Examples. That is, it can be seen that as compared to the darkening pattern layer using copper oxides, the darkening pattern layer using the copper-manganese-based material according to the Examples has an effect of further improving the concealing property of the conductive pattern.

The optical constant average refractive index n and the average extinction coefficient k of the conductive structure bodies according to Examples 1 to 4 were measured by the ellipsometer, and as a result, the average refractive index was 2.68 and the average extinction coefficient was 0.69 at the wavelength of 600 nm or more and 750 nm or less.

The optical constant average refractive index n and the average extinction coefficient k of the conductive structure bodies according to Comparative Examples 1 to 4 were measured by the ellipsometer, and as a result, the average refractive index was 2.48 and the average extinction coefficient was 0.25 at the wavelength of 600 nm or more and 750 nm or less.

As a result, it can be seen that the conductive structure bodies according to the Examples has the similar refractive index and the higher extinction coefficient value as compared to the conductive structure bodies according to the Comparative Examples. Accordingly, it can be seen that the conductive structure body according to the present application has an effect of improving the concealing property of the conductive pattern.

The color difference value of the conductive structure bodies according to Examples 1 to 4 and the color of the darkening pattern layer are described in the following Table 2.

TABLE 2

| # | $L^*$ | $a^*$ | $b^*$ | Color |
|---|---|---|---|---|
| EXAMPLE 1 | 37.18 | −13.30 | −20.09 | |
| EXAMPLE 2 | 53.10 | −6.94 | −6.37 | |
| EXAMPLE 3 | 45.55 | −10.56 | −12.91 | |
| EXAMPLE 4 | 30.76 | −10.44 | −24.58 | |

As seen from the result of Table 2, the darkening pattern layers of the conductive structure bodies according to the Examples have low chromaticity and brightness, and thus may effectively prevent a glare phenomenon of the conductive pattern layer.

In the conductive structure body according to the exemplary embodiment of the present specification, in order to measure heat resistance reliability of the darkening pattern layer, experiments according to the following Examples 5 to 11 and Comparative Examples 5 and 6 were performed.

COMPARATIVE EXAMPLE 5

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 0%.

The present experiment was performed to measure heat resistance of the darkening layer, and the separate patterning process was omitted.

COMPARATIVE EXAMPLE 6

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 10%.

The present experiment was performed to measure heat resistance of the darkening layer, and the separate patterning process was omitted.

EXAMPLE 5

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 20%.

The present experiment was performed to measure heat resistance of the darkening layer, and the separate patterning process was omitted.

EXAMPLE 6

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 29%.

The present experiment was performed to measure heat resistance of the darkening layer, and the separate patterning process was omitted.

EXAMPLE 7

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 50%.

The present experiment was performed to measure heat resistance of the darkening layer, and the separate patterning process was omitted.

EXAMPLE 8

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 71%.

The present experiment was performed to measure heat resistance of the darkening layer, and the separate patterning process was omitted.

EXAMPLE 9

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 77%.

The present experiment was performed to measure heat resistance of the darkening layer, and the separate patterning process was omitted.

EXAMPLE 10

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the oxygen fraction was 100%.

The present experiment was performed to measure heat resistance of the darkening layer, and the separate patterning process was omitted.

EXAMPLE 11

After the metal layer was formed on the board by using Cu, the darkening layer having the thickness of 46 nm was formed on the metal layer by using the Cu—Mn alloy target including 10 mass % of Mn by the radio frequency sputtering (RF sputtering) method under the atmosphere where the nitrogen fraction was 100%.

The present experiment was performed to measure heat resistance of the darkening layer, and the separate patterning process was omitted.

The result obtained by measuring the component ratio of each element of the darkening layers formed by Comparative Examples 5 and 6 and Examples 5 to 11 is described in the following Table 3.

TABLE 3

|  | O content (%) | Mn content (%) | Cu content (%) | N content (%) |
| --- | --- | --- | --- | --- |
| Comparative Example 5 | 4 | 19 | 77 | — |
| Comparative Example 6 | 18 | 12 | 70 |  |
| Example 5 | 32 | 10 | 58 |  |
| Example 6 | 49 | 4 | 47 |  |
| Example 7 | 52 | 3 | 45 |  |
| Example 8 | 51 | 4 | 45 |  |
| Example 9 | 52 | 3 | 45 |  |
| Example 10 | 52 | 3 | 45 |  |
| Example 11 | 7 | 12 | 70 | 11 |

Moreover, the darkening layers manufactured according to Comparative Example 5, Comparative Example 6, Example 7, Example 10, and Example 11 were subjected to the heat resistance test under the atmosphere at 150° C. for 24 hours to observe whether the darkening layer was damaged.

Figure 5:
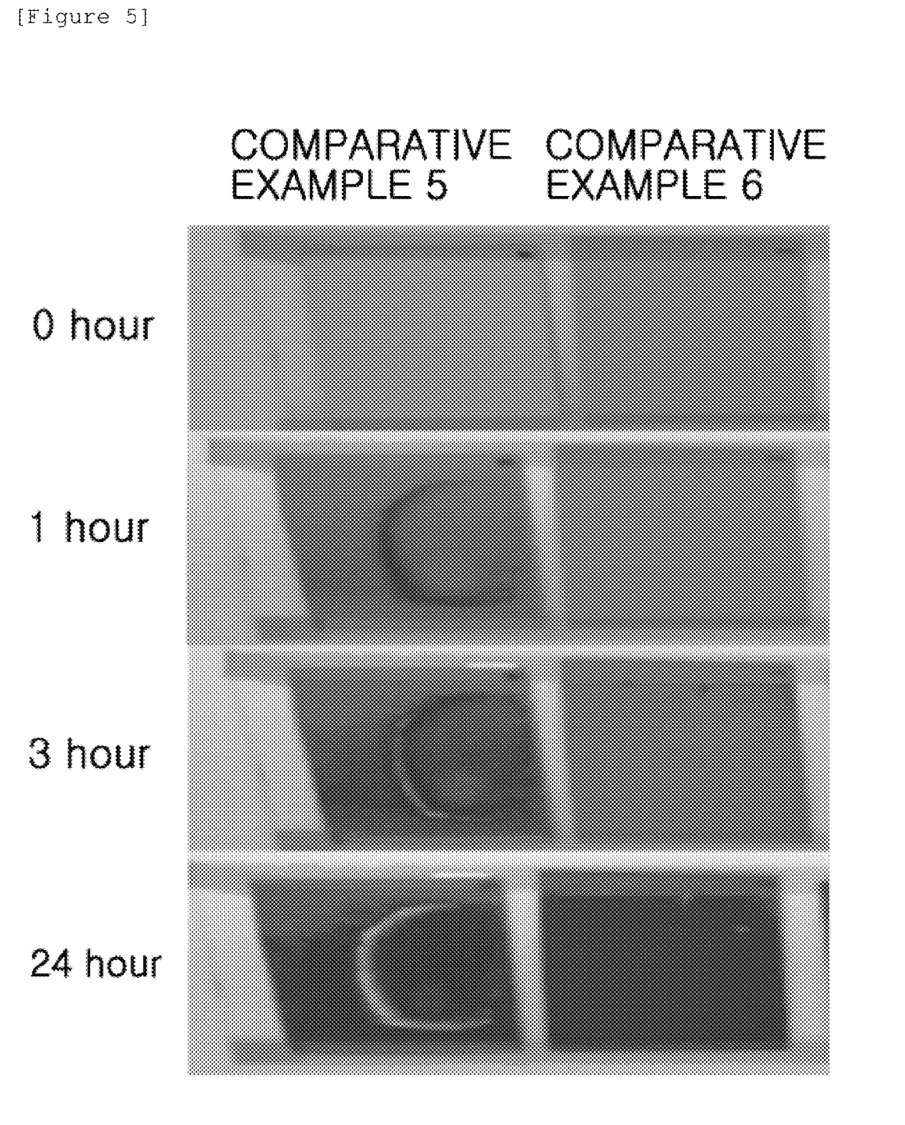
FIG. 5 illustrates a heat resistance test result of darkening layers manufactured according to Comparative Example 5 and Comparative Example 6.

FIG. 5 illustrates a heat resistance test result of the darkening layers manufactured according to Comparative Example 5 and Comparative Example 6.

Figure 6:
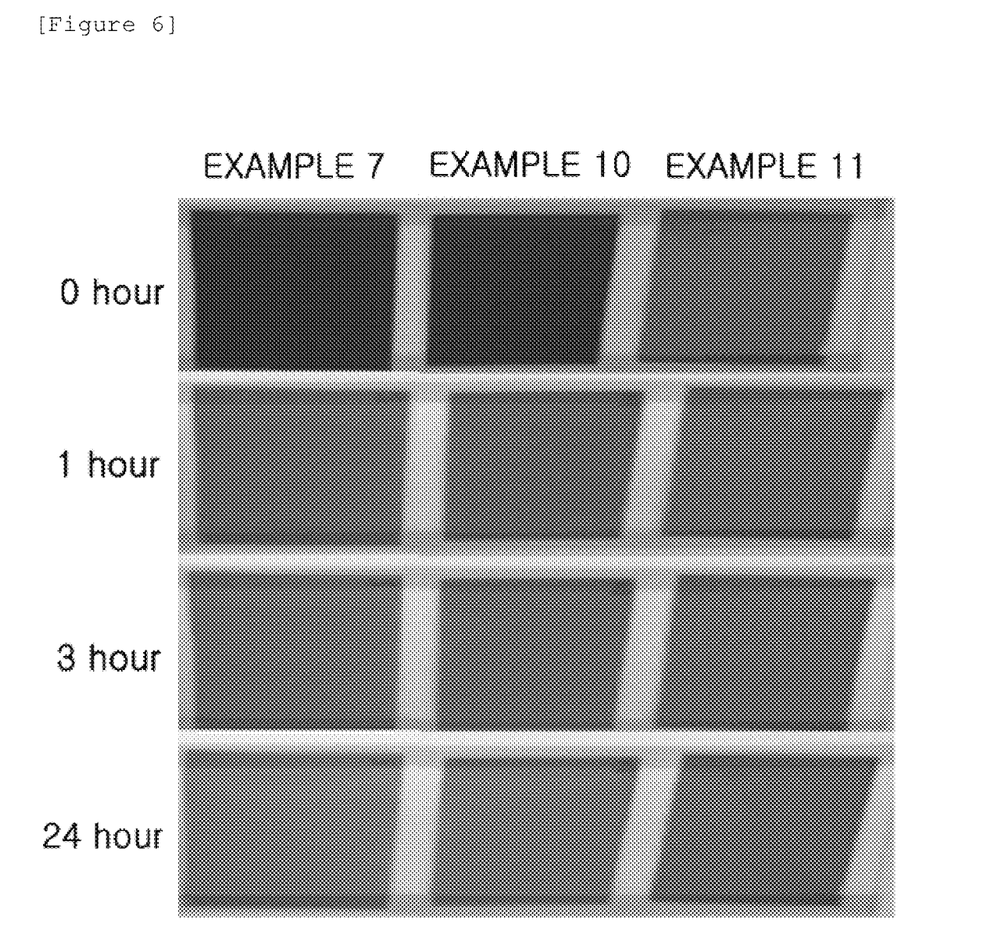
FIG. 6 illustrates a heat resistance test result of darkening layers manufactured according to Example 7, Example 10, and Example 11.

FIG. 6 illustrates a heat resistance test result of the darkening layers manufactured according to Example 7, Example 10, and Example 11.

Comparing the results of FIGS. 5 and 6 to each other, it can be confirmed that while the darkening layers according to the Comparative Examples are subjected to the heat resistance test, the lower metal layer is exposed. However, it can be confirmed that in the darkening layers according to the Examples, even though the heat resistance test is performed, only a change in hue is observed and the lower metal layer is not exposed. This means that since the darkening layers according to the Examples have the more excellent heat resistance property, even though the high temperature atmosphere is formed when the darkening layer is applied to products or a process condition, a glare phenomenon of the metal pattern layer may be effectively prevented.

Moreover, as seen from the result according to Example 11, it can be confirmed that in the case where the copper-manganese-based material included in the darkening layer contains N, even though the O content is low at the same level as that of the Comparative Examples, a darkening function is effectively implemented, and moreover, it can be seen that even though the darkening layer is subjected to the heat resistance test, there is an effect in that a change in hue is hardly observed.

COMPARATIVE EXAMPLE 7

In the case where ZnO was used as the material of the darkening pattern layer, in order to confirm whether the darkening property is implemented, the pattern layer formed of ZnO was formed on the copper pattern layer formed on the board to manufacture the conductive structure body. Moreover, a change in reflectance of the conductive structure body in the case where the thickness of the pattern layer formed of ZnO was 20 nm, 30 nm, 40 nm, 50 nm, 60 nm, and 100 nm was simulated.

Figure 7:
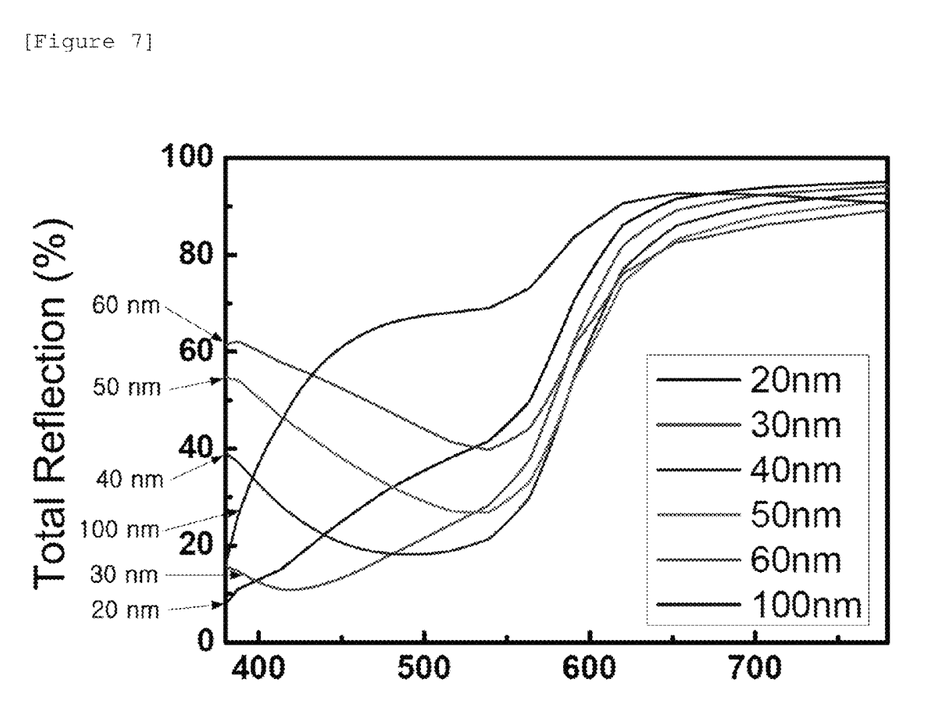
FIG. 7 illustrates simulation of a change in reflectance of a conductive structure body manufactured according to Comparative Example 7.

FIG. 7 illustrates simulation of a change in reflectance of the conductive structure body manufactured according to Comparative Example 7.

As seen from the result of FIG. 7, in ZnO that is one of metal oxides, there is a section where reflection is very large in a visible ray region, and thus a glare phenomenon of the lower conductive pattern layer cannot be effectively prevented.

The invention claimed is:
1. A conductive structure body comprising:
a substrate;
a conductive pattern layer provided on the substrate; and
a darkening pattern layer provided on at least one surface of the conductive pattern layer,
wherein the darkening pattern layer includes a copper-manganese-based material represented by $Cu_aMn_bO_cN_d$,
in the copper-manganese-based material,
b is a mass ratio of Mn to the copper-manganese-based material and 0.01 or more and 0.5 or less,
c is a mass ratio of O to the copper-manganese-based material and 0.05 or more and 0.6 or less,
d is a mass ratio of N to the copper-manganese-based material and 0 or more and 0.15 or less, and
a is a mass ratio of Cu to the copper-manganese-based material and a remainder value to a sum of the mass ratios of components other than Cu.
2. The conductive structure body of claim 1, wherein in the copper-manganese-based material, d is 0, and c is 0.25 or more and 0.6 or less.
3. The conductive structure body of claim 1, wherein in the copper-manganese-based material, d is more than 0 and 0.15 or less, and c +d is 0.15 or more and 0.6 or less.
4. The conductive structure body of claim 1, wherein total reflectance of the conductive structure body is 25% or less.
5. The conductive structure body of claim 2, wherein the conductive pattern layer is provided between the substrate and the darkening pattern layer, and the total reflectance is measured on a surface of the substrate, on which the conductive pattern is provided.
6. The conductive structure body of claim 2, wherein the darkening pattern layer is provided between the substrate and the conductive pattern layer, and the total reflectance is measured on an opposite surface of the surface of the substrate, on which the conductive pattern is provided.
7. The conductive structure body of claim 1, wherein an extinction coefficient k of the darkening pattern layer is 0.2 or more and 2.5 or less.
8. The conductive structure body of claim 1, wherein a refractive index of the darkening pattern layer is 0 or more and 3 or less.
9. The conductive structure body of claim 1, wherein a thickness of the darkening pattern layer is 20 nm or more and 100 nm or less.
10. The conductive structure body of claim 1, wherein surface resistance of the conductive structure body is more than 0 Ω/square and 300 Ω/square or less.
11. The conductive structure body of claim 1, wherein in the conductive structure body, based on a CIE L*a*b* color coordinate, brightness L* is 55 or less and chromaticity a* and b* are 0 or less.
12. The conductive structure body of claim 1, wherein a thickness of the conductive pattern layer is 0.01 μm or more and 10 μm or less.
13. The conductive structure body of claim 1, wherein the conductive pattern layer includes one or more materials selected from the group consisting of a metal, a metal alloy, metal oxide, and metal nitride, and
the materials have specific resistance of $1 \times 10^6$ Ω·cm or more and $30 \times 10^6$ Ω·cm or less.
14. The conductive structure body of claim 1, wherein a line width of a pattern of the conductive pattern layer is 10 μm or less.
15. A touch screen panel comprising:
the conductive structure body of claim 1.
16. A display device comprising:
the conductive structure body of claim 1.
17. A solar battery comprising:
the conductive structure body of claim 1.
18. A method for manufacturing a conductive structure body, comprising:
preparing a substrate;
forming a conductive pattern layer on the substrate; and
forming a darkening pattern layer on an upper surface, a lower surface, or the upper surface and the lower surface of the conductive pattern layer,
wherein the darkening pattern layer includes a copper-manganese-based material represented by $Cu_aMn_bO_cN_d$,
in the copper-manganese-based material,
b is a mass ratio of Mn to the copper-manganese-based material and 0.01 or more and 0.5 or less,
c is a mass ratio of O to the copper-manganese-based material and 0.05 or more and 0.6 or less,
d is a mass ratio of N to the copper-manganese-based material and 0 or more and 0.15 or less, and a is a mass ratio of Cu to the copper-manganese-based material and a remainder value to a sum of the mass ratios of components other than Cu.

19. The method of claim 18, wherein the forming of the conductive pattern layer includes forming a conductive layer on the substrate,
- wherein the forming of the darkening pattern layer includes forming a darkening layer on an upper surface, a lower surface, or the upper surface and the lower surface of the conductive layer, and
- the conductive pattern layer and the darkening pattern layer are formed by simultaneous patterning of the conductive layer and the darkening layer.

20. The method of claim 19, wherein in the simultaneous patterning, batch etching is performed by using an etchant.

* * * * *